(12) United States Patent
Kang et al.

(10) Patent No.: US 11,868,740 B2
(45) Date of Patent: Jan. 9, 2024

(54) TERNARY LOGIC CIRCUIT DEVICE

(71) Applicant: POSTECH Research and Business Development Foundation, Pohang-si (KR)

(72) Inventors: Seokhyeong Kang, Pohang-si (KR); Sunmean Kim, Pohang-si (KR); Sunghye Park, Daegu (KR); SungYun Lee, Busan (KR)

(73) Assignee: Postech Research and Business Development Foundation, Pohang-si (KR)

( * ) Notice: Subject to any disclaimer, the term of this patent is extended or adjusted under 35 U.S.C. 154(b) by 0 days.

(21) Appl. No.: 17/489,629

(22) Filed: Sep. 29, 2021

(65) Prior Publication Data

US 2022/0350568 A1 Nov. 3, 2022

(30) Foreign Application Priority Data

Apr. 29, 2021 (KR) .................. 10-2021-0055863

(51) Int. Cl.
*G06F 7/502* (2006.01)
*H03K 19/173* (2006.01)
*H03K 19/094* (2006.01)

(52) U.S. Cl.
CPC .......... *G06F 7/502* (2013.01); *H03K 19/173* (2013.01); *H03K 19/094* (2013.01)

(58) Field of Classification Search
CPC . G06F 7/42; G06F 7/483; G06F 7/485; G06F 7/49–4912; G06F 7/50–5095; G06F 7/57–575; G06F 7/461; G06F 7/4981; G06F 2207/4922; G06F 2207/4924; G06F 2207/4802; G06F 2207/4816; G06F 2207/4818; G06F 2207/4826;
(Continued)

(56) References Cited

U.S. PATENT DOCUMENTS

| 8,429,485 B2 * | 4/2013 | Kim ................. H03M 13/3707 |
| | | 714/752 |
| 2010/0049779 A1 * | 2/2010 | Blaner .................... G06F 7/505 |
| | | 708/670 |

OTHER PUBLICATIONS

S. Kim, S.-Y. Lee, S. Park, K. R. Kim and S. Kang, "A Logic Synthesis Methodology for Low-Power Ternary Logic Circuits," in IEEE Transactions on Circuits and Systems I: Regular Papers, vol. 67, No. 9, pp. 3138-3151, May 7, 2020, doi: 10.1109/TCSI.2020.2990748. (Year: 2020).*

(Continued)

*Primary Examiner* — Emily E Larocque
*Assistant Examiner* — Carlo Waje
(74) *Attorney, Agent, or Firm* — Morgan, Lewis & Bockius LLP

(57) ABSTRACT

A circuit includes a first full adder, a second full adder, a first half adder, a third full adder configured to receive a sum output signal of the first full adder, a sum output signal of the second full adder, and a sum output signal of the first half adder, a fourth full adder configured to receive a carry output signal of the first full adder, a carry output signal of the second full adder, and a carry output signal of the first half adder, a second half adder configured to receive a carry output signal of the third full adder and a sum output signal of the fourth full adder, and a third half adder configured to receive a carry output signal of the second half adder and a carry output signal of the fourth full adder.

9 Claims, 14 Drawing Sheets

(58) Field of Classification Search
CPC ............. H03K 19/094; H03K 19/0944; H03K 19/09425; H03K 19/173; H03K 19/20; H03K 19/002
See application file for complete search history.

(56) References Cited

OTHER PUBLICATIONS

Memon, Tayab & Halepoto, Irfan & Alotaibi, Ahmed. (2013). Realizing Ternary Logic in FPGAs for SWL DSP Systems. Mehran University Research Journal of Engineering & Technology,[ISSN 0254-7821]. 32. 401-408. (Year: 2013).*
P. S. Peercy, "The drive to miniaturization," Nature, vol. 406, No. 6799, pp. 1023-1026, Aug. 2000.
R. Ho, K. W. Mai, and M. A. Horowitz, "The future of wires," Proc. IEEE, vol. 89, No. 4, pp. 490-504, Jul. 2001.
G. Yeap, "Smart mobile SoCs driving the semiconductor industry: Technology trend, challenges and opportunities," in IEDM Tech. Dig., Dec. 2013. pp. 1.3.1-1.3.8.
N. Magen, A. Kolodny, U. Weiser, and N. Shamir, "Interconnect-power dissipation in a microprocessor," in Proc. Int. workshop Syst. Level Interconnect Predict., 2004, pp. 7-13.
Y. Taur, "CMOS design near the limit of scaling," IBM J. Res. Develop., vol. 46, No. 2.3, pp. 213-222, Mar. 2002.
S. Iijima and T. Ichihashi, "Single-shell carbon nanotubes of 1-nm diameter," Nature, vol. 363, No. 6430, pp. 603-605, Jun. 1993.
R. H. Baughman, "Carbon nanotubes—The route toward applications," Science, vol. 297, No. 5582, pp. 787-792, Aug. 2002.
V. Gaudet, "A survey and tutorial on contemporary aspects of multiplevalued logic and its application to microelectronic circuits," IEEE J. Emerg. Sel. Topics Circuits Syst., vol. 6, No. 1, pp. 5-12, Mar. 2016.
L. Hurst, "Multiple-valued logic—Its status and its future," IEEE Trans. Comput., vols. C-33, No. 12, pp. 1160-1179, Dec. 1984.
K. C. Smith, "A multiple valued logic: A tutorial and appreciation," Computer, vol. 21, No. 4, pp. 17-27, Apr. 1988.
X. W. Wu and F. P. Prosser, "CMOS ternary logic circuits," IEE Proc. G Circuits, Devices Syst., vol. 137, No. 1, pp. 21-27,1990.
A. Raychowdhury and K. Roy, "Carbon-nanotube-based voltage-mode multiple-valued logic design," IEEE Trans. Nanotechnol., vol. 4, No. 2, pp. 168-179, Mar. 2005.
Y. Kang et al., "A novel ternary multiplier based on ternary CMOS compact model," in Proc. IEEE 47th Int. Symp. Multiple-Valued Log. (ISMVL), May 2017, pp. 25-30.
S. Heo et al., "Ternary full adder using multi-threshold voltage graphene barristors," IEEE Electron Device Lett., vol. 39, No. 12, pp. 1948-1951, Dec. 2018.
H. Yoo et al., "Negative transconductance heterojunction organic transistors and their application to full-swing ternary circuits," Adv. Mater., vol. 31, No. 29, Jul. 2019, Art. No. 1808265.
L. Lee et al., "ZnO composite nanolayer with mobility edge Quantization for multi-value logic transistors," Nature Commun., vol. 10, No. 1, p. 1998, 2019.
S. Kim, S.-Y. Lee, S. Park, and S. Kang, "Design of quad-edge-triggered sequential logic circuits for ternary logic," in Proc. IEEE 49th Int. Symp. Multiple-Valued Log. (ISMVL), May 2019, pp. 37-42.
J. W. Jeong et al., "Tunnelling-based ternary metal oxide semiconductor technology," Nature Electron., vol. 2, No. 7, pp. 307-312, 2019.
A. Heung and H. T. Mouftah, "Depletion/enhancement CMOS for a lower power family of three-valued logic circuits," IEEE J. Solid-State Circuits, vol. 20, No. 2, pp. 609-616, Apr. 1985.
R. A. Jaber, A. Kassem, A. M. El-Hajj, L. A. El-Nimri, and A. M. Haidar, "High-performance and energy-efficient CNFETbased designs for ternary logic circuits," IEEE Access, vol. 7. pp. 93871-93886, 2019.
S. Lin, Y.-B. Kim, and F. Lombardi, "A novel CNTFET-based ternary logic gate design," in Proc. 52nd IEEE Int. Midwest Symp. Circuits Syst., Aug. 2009, pp. 435-438.
J. Deng and H.-S.-P. Wong, "A compact SPICE model for carbon-nanotube field-effect transistors including nonidealities and its application—Part I: Model of the intrinsic channel region," IEEE Trans. Electron Devices, vol. 54, No. 12, pp. 3186-3194, 2007.
J. Deng et al., "A compact SPICE model for carbon-nanotube field-effect transistors including nonidealities and its application—Part II: Full device model and circuit performance benchmarking," IEEE Trans. Electron Devices, vol. 54, No. 12 2007.
S. Lin, Y.-B. Kim, and F. Lombardi, "CNTFET-based design of ternary logic gates and arithmetic circuits," IEEE Trans. Nanotechnol., vol. 10, No. 2, pp. 217-225, Mar. 2011.
B. Srinivasu and K. Sridharan, "A synthesis methodology for ternary logic circuits in emerging device technologies," IEEE Trans. Circuits Syst. I, Reg. Papers, vol. 64, No. 8, pp. 2146-2159, Aug. 2017.
S. Kim, T. Lim, and S. Kang, "An optimal gate design for the synthesis of ternary logic circuits," in Proc. 23rd Asia South Pacific Design Autom. Conf. (ASP-DAC), Jan. 2018, pp. 476-481.
C. Vudadha, A. Surya, S. Agrawal, and M. B. Srinivas, "Synthesis of ternary logic circuits using 2:1 multiplexers," IEEE Trans. Circuits Syst. I, Reg. Papers, vol. 65, No. 12, pp. 4313-4325, Oct. 2018.
S.-Y. Lee, S. Kim, and S. Kang, "Ternary logic synthesis with modified Quine-McCluskey algorithm," in Proc. IEEE 49th Int. Symp. Multiple Valued Log. (ISMVL), May 2019, pp. 158-163.
D. M. Miller and M. A. Thornton, Multiple Valued Logic: Concepts and Representations. San Rafael, CA, USA: Morgan & Claypool, 2008.
P. Dwivedi, K. Kumar, and A. Islam, "Comparative study of subthreshold leakage in CNFET & MOSFET 32-nm technology node," in Proc. Int. Conf. Microelectron., Comput. Commun. (MicroCom), Jan. 2016, pp. 1-5.
M. H. Moaiyeri, A. Doostaregan, and K. Navi, "Design of energyefficient and robust ternary circuits for nanotechnology," IET Circuits, Devices Syst., vol. 5, No. 4, pp. 285-296, 2011.
W. V. Quine, "The problem of simplifying truth functions," Amer. Math. Monthly, vol. 59, No. 8, pp. 521-531, Oct. 1952.
M. Hawash, M. Lukac, M. Kameyama, and M. Perkowski, "Multiplevalued reversible benchmarks and extensible quantum specification (XQS) format," in Proc. IEEE 43rd Int. Symp. Multiple-Valued Log., May 2013, pp. 41-46.

* cited by examiner

TERNARY LOGIC CIRCUIT DEVICE

STATEMENT REGARDING FOREIGN GOVERNMENT RIGHTS

This work was supported by the Institute of Information & Communications Technology Planning & Evaluation (IITP) grant funded by the Republic of Korea government (MSIT). (No. 2022-0-01172, DRAM PIM Design Base Technology Development).

CROSS-REFERENCE TO RELATED APPLICATION(S)

This application claims the benefit of Korean Patent Application No. 10-2021-0055863, filed on Apr. 29, 2021, in the Korean Intellectual Property Office, the disclosure of which is incorporated herein by reference.

BACKGROUND

1. Field of the Invention

One or more example embodiments relate to technology for a ternary logic circuit device designed based on transistors.

2. Description of the Related Art

The performance of computing systems has been continuously improved through fine semiconductor processes. However, further performance improvement through the fine process is frustrated by an explosive increase in power density. To solve this issue, a multiple-valued logic has been proposed. A multiple-valued logic is a computing method that performs a computation using more than three logic states and has a great advantage of reducing area and power consumption compared to a binary logic. In particular, a ternary logic device may considerably lower the circuit complexity compared to a binary logic device. Hereinafter, a ternary logic circuit device for implementing various functions will be described.

SUMMARY

According to an aspect, there is provided a circuit including a first full adder, a second full adder, a first half adder, a third full adder configured to receive a sum output signal of the first full adder, a sum output signal of the second full adder, and a sum output signal of the first half adder, a fourth full adder configured to receive a carry output signal of the first full adder, a carry output signal of the second full adder, and a carry output signal of the first half adder, a second half adder configured to receive a carry output signal of the third full adder and a sum output signal of the fourth full adder, and a third half adder configured to receive a carry output signal of the second half adder and a carry output signal of the fourth full adder, wherein the third full adder, the second half adder, and the third half adder may be configured to output voltage signals corresponding to a sum of logical values indicated by input signals applied to the first full adder, the second full adder, and the first half adder.

The first full adder, the second full adder, the third full adder, and the fourth full adder may be ternary full adders (TFAs), and the first half adder, the second half adder, and the third half adder may be ternary half adders (THAs).

The first full adder, the second full adder, the third full adder, and the fourth full adder may be binary full adders (BFAs), and the first half adder, the second half adder, and the third half adder may be binary half adders (BHAs), wherein the circuit may further include a positive ternary inverter (PTI), and a binary inverter connected between the PTI and one of the first full adder, the second full adder, and the first half adder.

The circuit may further include a negative ternary inverter (NTI), a fifth BFA, a sixth BFA, a fourth BHA, a seventh BFA configured to receive a sum output signal of the fifth BFA, a sum output signal of the sixth BFA, and a sum output signal of the fourth BHA, an eighth BFA configured to receive a carry output signal of the fifth BFA, a carry output signal of the sixth BFA, and a carry output signal of the fourth BHA, a fifth BHA configured to receive a carry output signal of the seventh BFA and a sum output signal of the eighth BFA, and a sixth BHA configured to receive a carry output signal of the fifth BHA and a carry output signal of the eighth BFA.

The circuit may further include a ninth BFA configured to receive a sum output signal of the third full adder, an inverting signal for a sum output signal of the seventh BFA, and a drain voltage, a tenth BFA configured to receive a sum output signal of the second half adder, an inverting signal for a sum output signal of the fifth BHA, and a carry output signal of the ninth BFA, an eleventh BFA configured to receive a sum output signal of the third half adder, an inverting signal for a sum output signal of the sixth BHA, and a carry output signal of the tenth BFA, and a twelfth BFA configured to receive a carry output signal of the third half adder, an inverting signal for a carry output signal of the sixth BHA, and a carry output signal of the eleventh BFA.

The circuit may further include a C0 gate configured to receive a sum output signal of the twelfth BFA, a PNMIN gate configured to receive a plurality of input signals, and a multiplexer configured to selectively output one of a drain voltage and an output signal of the C0 gate received as input signals, based on an output signal of the PNMIN gate received as a selected signal.

The C0 gate may be configured to output a ground voltage when one of a half drain voltage and a drain voltage is received, and output a half drain voltage when a ground voltage is received.

The PNMIN gate may be configured to output a drain voltage when a minimum voltage among the plurality of input signals applied to the PNMIN gate is a ground voltage or a half drain voltage, and output a ground voltage when the minimum voltage among the applied input signals is a drain voltage.

According to another aspect, there is provided a circuit including a first full adder, a second full adder, a first half adder, a third full adder configured to receive a sum output signal of the first full adder, a sum output signal of the second full adder, and a sum output signal of the first half adder, a fourth full adder configured to receive a carry output signal of the first full adder, a carry output signal of the second full adder, and a carry output signal of the first half adder, a second half adder configured to receive a carry output signal of the third full adder and a sum output signal of the fourth full adder, and a ternary sum gate configured to receive a carry output signal of the second half adder and a carry output signal of the fourth full adder, wherein the third full adder, the second half adder, and the ternary sum gate may be configured to output voltage signals corresponding to a sum of logical values indicated by input signals applied to the first full adder, the second full adder, and the first half adder.

The first full adder, the second full adder, the third full adder, and the fourth full adder may be TFAs, and the first half adder and the second half adder are THAs.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
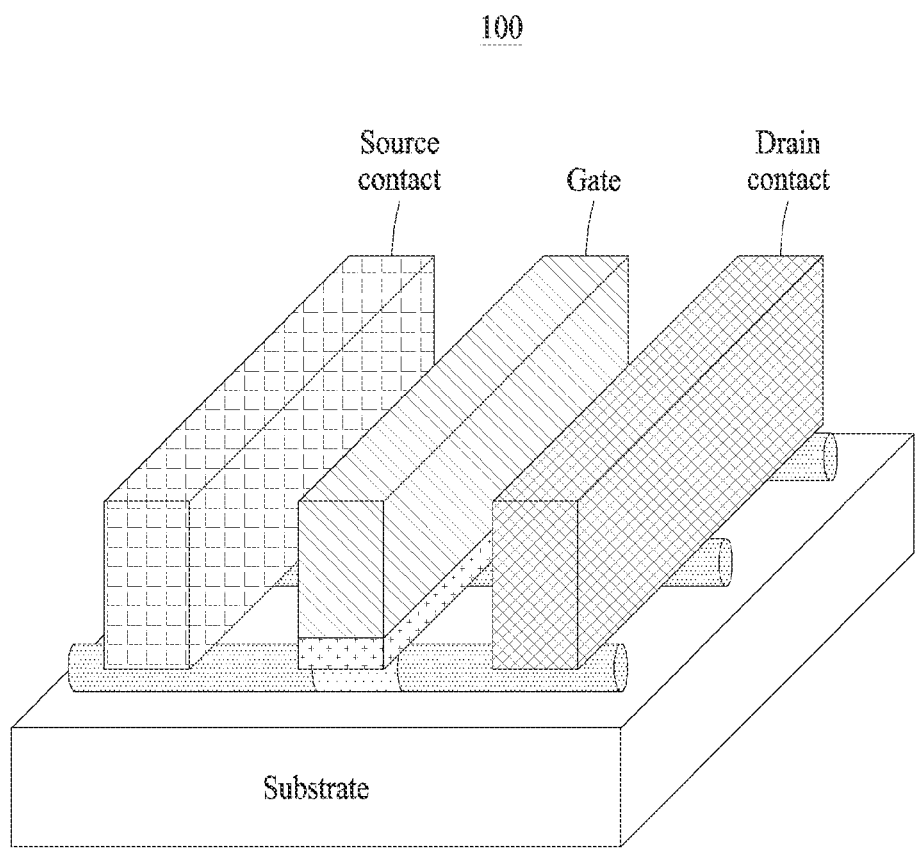
FIG. 1 illustrates a structure of a single-walled carbon nanotube field-effect transistor (CNTFET)

The following detailed structural or functional description is provided as an example only and various alterations and modifications may be made to the examples. Here, the examples are not construed as limited to the disclosure and should be understood to include all changes, equivalents, and replacements within the idea and the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, example embodiments will be described in detail with reference to the accompanying drawings. When describing the example embodiments with reference to the accompanying drawings, like reference numerals refer to like components and a repeated description related thereto will be omitted.

FIG. 1 illustrates a structure of a single-walled carbon nanotube field-effect transistor (CNTFET).

A single-walled carbon nanotube field-effect transistor (CNTFET) 100) is a field-effect transistor where a single-walled carbon nanotube (SWCNT) is inserted into a transistor. Hereinafter, a single-walled carbon nanotube field-effect transistor will be referred to as CNTFET.

A MOSFET-like CNTFET includes drain, gate, source, and body terminals. A carbon nanotube may operate as a conductor or a semiconductor according to a chiral vector. The chiral vector represents an angle of arrangement of carbon atoms. The chiral vector may be represented by (n, m), where n and m are integers. The chiral vector is a significant factor that determines a threshold voltage of the CNTFET. The threshold voltage of the CNTFET is inversely proportional to a diameter of the carbon nanotube. A relationship among the threshold voltage, the diameter of the carbon nanotube, and the element value n of the chiral vector may be expressed by Equation 1.

$$\frac{V_{t1}}{V_{t2}} = \frac{D_{CNT2}}{D_{CNT1}} = \frac{n_2}{n_1} \qquad \text{[Equation 1]}$$

In Equation 1, Vt1 and Vt2 denote threshold voltages of the CNTFET, DCNT1 and DCNT2 denote the diameters of the CNTFET, and n1 and n2 denote element values of the chiral vector.

The following Table 1 shows diameters and threshold voltages of carbon nanotubes according to respective chiral vectors. Three types of CNTFETs having different threshold voltages may be used for n-type and p-type transistors.

TABLE 1

| (n, m) | DCNT(nm) | Vtn(V) | Vtp(V) |
|---|---|---|---|
| (17.0) | 1.331 | 0.323 | −0.323 |
| (13.0) | 1.017 | 0.428 | −0.428 |
| (8.0) | 0.626 | 0.687 | −0.687 |

In an example embodiment, a ternary logic circuit uses a turn-on/turn-off state operation of the CNTFET. A turn-on/turn-off switching operation is based on the principle that a source-drain current of a CNTFET is determined based on a gate voltage. In a general operation, like an operation of a CMOS, when a drain voltage VDD is input to a gate of a p-type CNTFET, no current flows between a source and a drain such that the p-type CNTFET is turned off. If a ground voltage GND is input to the gate of the p-type CNTFET, a current flows between the source and the drain such that the p-type CNTFET is turned on. Conversely, when a drain voltage VDD is input to a gate of an n-type CNTFET, a current flows between a source and a drain such that the n-type CNTFET is turned on. If a ground voltage GND is input to the gate of the n-type CNTFET, no current flows between the source and the drain such that the n-type CNTFET is turned off.

Furthermore, when a half drain voltage VDD/2, that is, 0.45 volts (V) is input to the gate of the CNTFET, the p-type CNTFET and the n-type CNTFET having a chiral vector of (17, 0) are turned on, and the p-type CNTFET and the n-type CNTFET having a chiral vector of (8, 0) are turned off.

Binary Logic Circuit

A binary logic circuit is a logic circuit that is based on two logical values. Binary logic uses logical values "0" and "1". A binary logic gate is a circuit for performing a logical operation of a binary function. The binary logic gate may represent two logical values using two voltage levels, as shown in Table 2 below.

TABLE 2

| Voltage Level | Binary logical value |
| --- | --- |
| Ground voltage (Gnd) | 0 |
| Drain voltage (VDD) | 1 |

Ternary Logic Circuit

A ternary logic circuit is a logic circuit that is based on three logical values. The ternary logic circuit includes an unbalanced ternary logic that uses logical values "0", "1", and "2" and a balanced ternary logic that uses logical values "−1", "0", and "1". A ternary logic gate is a circuit for performing a logical operation of a ternary function. The ternary logic gate may represent three logical values using three voltage levels, as shown in Table 3 below.

TABLE 3

| | Ternary logical value | |
| --- | --- | --- |
| Voltage Level | Unbalanced | Balanced |
| Ground voltage (Gnd) | 0 | −1 |
| Half drain voltage (VDD/2) | 1 | 0 |
| Drain voltage (VDD) | 2 | 1 |

Static Gate Design

A static gate may include a pull-up network and a pull-down network. Hereinafter, a network refers to a structure in which elements are physically connected. The terms "network" and "circuit" may be used in the same sense. For example, a pull-up network and a pull-down network may be a pull-up circuit and a pull-down circuit. The pull-up network and the pull-down network may include a combination of transistors, wherein the connectivity of the networks may be determined based on a switching operation of the transistors according to input voltages. The pull-up network may be connected to a drain power source that supplies a drain voltage, and include p-type transistors. Conversely, the pull-down network may be connected to a ground that supplies a ground voltage, and include n-type transistors.

Figure 2:
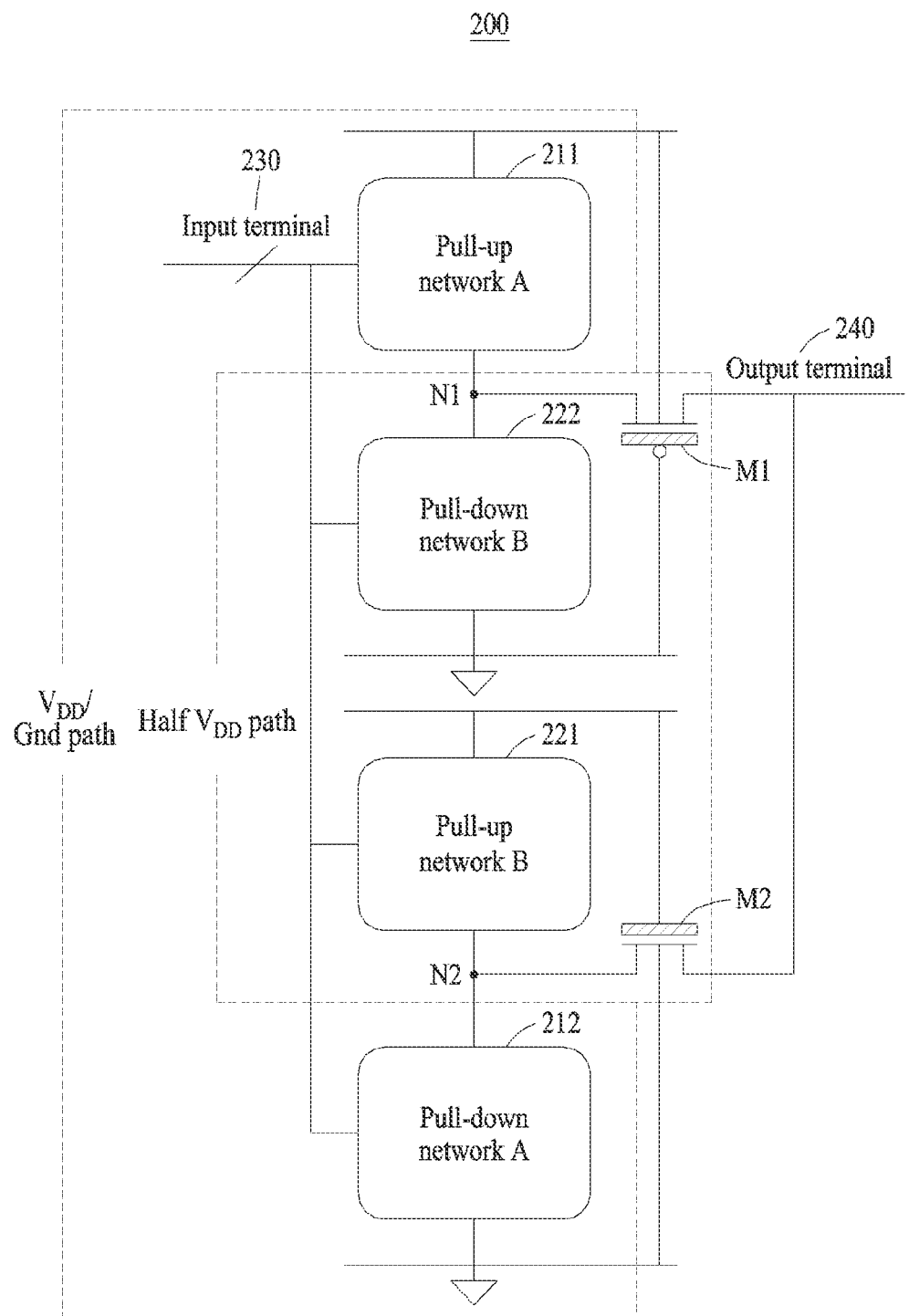
FIG. 2 illustrates a static gate for a ternary logic gate.

FIG. 2 illustrates a static gate for a ternary logic gate.

A static gate 200 for a ternary logic gate may include a first pull-up circuit 211, a first pull-down circuit 212, a second pull-up circuit 221, a second pull-down circuit 222, a first transistor M1, and a second transistor M2. Hereinafter, the first transistor M1 will be referred to as the first pass transistor M1, and the second transistor M2 will be referred to as the second pass transistor M2. The static gate 200 for a ternary logic gate may include a single-walled carbon nanotube field-effect transistor (CNTFET).

The static gate 200 may have a drain-ground (VDD/GND) path for outputting a drain voltage through the first pass transistor M1 when the first pull-up circuit 211 is turned on and for outputting a ground voltage through the second pass transistor M2 when the first pull-down circuit 212 is turned on. Further, the static gate 200 may include a half drain path for outputting a half drain (VDD/2) voltage through the first pass transistor M1 and the second pass transistor M2 when both the second pull-up circuit 221 and the second pull-down circuit 222 are turned on. The first pass transistor M1 may connect a node N1 between the first pull-up circuit 211 and the second pull-down circuit 222 to an output terminal 240, and the second pass transistor M2 may connect a node N2 between the second pull-up circuit 221 and the first pull-down circuit 212 to the output terminal 240.

In the static gate 200, the first pull-up circuit 211 may connect the second pull-down circuit 222, a drain power source that supplies a drain voltage, and the first pass transistor M1. The first pull-down circuit 212 may connect the second pull-up circuit 221, a ground that supplies a ground voltage, and the second pass transistor M2. The second pull-up circuit 221 may connect the first pull-down circuit 212, the drain power supply that supplies a drain voltage, and the second pass transistor M2. The second pull-down circuit 222 may connect the first pull-up circuit 211, the ground that supplies a ground voltage, and the first pass transistor M1.

In summary, a drain voltage VDD may be transmitted from the drain power source to the output terminal 240 when the first pull-up circuit 211 is turned on, and a ground voltage GND may be transmitted from the ground to the output terminal 240 when the first pull-down circuit 212 is turned on. The second pull-up circuit 221, the second pull-down circuit 222, the first pass transistor M1, and the second pass transistor M2 may be used to transmit a half drain voltage (VDD/2) to the output terminal 240.

In the static gate 200, the first pull-up circuit 211 and the second pull-up circuit 221 may include doping-type transistors like the first pass transistor M1, and the first pull-down circuit 212 and the second pull-down circuit 222 may include doping-type transistors like the second pass transistor M2. Further, the first pass transistor M1 and the second pass transistor M2 may have opposite doping types. For example, the first pull-up circuit 211, the second pull-up circuit 221, and the first pass transistor M1 may be p-type transistors, and the first pull-down circuit 212, the second pull-down circuit 222, and the second pass transistor M2 may be n-type transistors. In the static gate 200, the plurality of circuits 211, 212, 221, and 222 may include two types of transistors having different threshold voltages. The static gate 200 may include a transistor having a first threshold voltage less than a half drain (VDD/2) voltage and a transistor having a second threshold voltage greater than or equal to the half drain voltage. The two types of transistors having different threshold voltages may be used for different switching operations when a half drain (VDD/2) is applied to an input terminal 230. When a half drain voltage is applied to the input terminal 230, the transistor having the first threshold voltage may be turned on, and the transistor having the second threshold voltage may be turned off. In addition, the first pass transistor M1 and the second pass transistor M2 in the static gate 200 may be transistors having a third threshold voltage between the first threshold voltage and the second threshold voltage. For example, the first threshold voltage may be 0.323 V, the second threshold voltage may be 0.687 V, and the third threshold voltage may be 0.428 V. However, example embodiments are not limited thereto.

The static gate 200 may output a half drain voltage (VDD/2). When a half drain voltage is output from the output terminal 240 in response to both the second pull-up circuit 221 and the second pull-down circuit 222 in the static gate 200 being turned on, both the first pass transistor M1 and the second pass transistor M2 may be turned off to maintain the output of the half drain voltage. Specifically, when the voltage of the output terminal 240 in the static gate 200 is reduced from a drain voltage to a half drain voltage, the second pull-down circuit 222 may be turned on, the voltage of the first node N1 may be changed from a drain voltage to a ground voltage, and the first pass transistor M1 connected to the first node N1 may maintain the output voltage as a half drain voltage. In this example, when the voltage of the first node N1 is less than or equal to a threshold voltage, the first pass transistor M1 may be turned off. Further, when the voltage of the output terminal 240 in the static gate 200 is increased from a ground voltage to a half drain voltage, the second pull-up circuit 221 may be turned on, the voltage of the second node N2 may be changed from a ground voltage to a drain voltage, and the second pass transistor M2 connected to the second node N2 may maintain the output voltage as a half drain voltage. In this example, when the voltage of the second node N2 is greater than or equal to a voltage obtained by subtracting a threshold voltage from the drain voltage, the second pass transistor M2 may be turned off.

Figure 3:
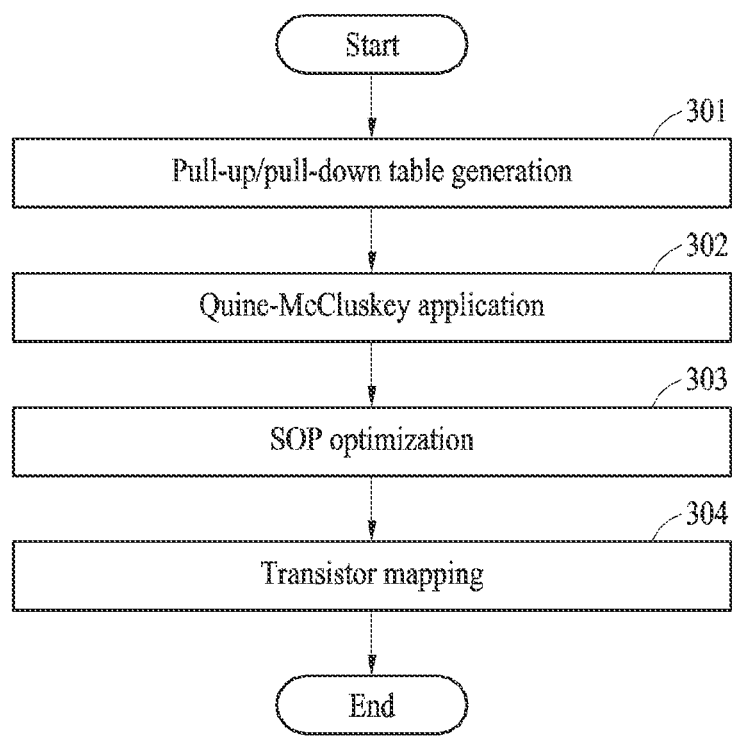
FIG. 3 is a flowchart illustrating a process of ternary logic synthesis.

FIG. 3 is a flowchart illustrating a process of ternary logic synthesis.

A ternary logic synthesis method may include pull-up/pull-down table generation operation 301, Quine-McCluskey algorithm application operation 302, sum of products (SOP) optimization operation 303, and transistor mapping operation 304.

First, in operation 301, the process of ternary logic synthesis generates pull-up and pull-down tables of a drain-ground path and pull-up and pull-down tables of a half drain (VDD/2) path using a truth table representing a ternary function. Each pull-up/pull-down table may represent a switching operation of a corresponding network. The pull-up/pull-down tables of the half drain path include don't-care terms and thus, need to be processed differently from the pull-up/pull-down tables of the drain-ground path. All possible pull-up/pull-down tables of the half drain path are generated by inserting turn-on or turn-off into all don't-care terms.

In operation 302, the Quine-McCluskey algorithm is applied to all the pull-up/pull-down tables of the drain-ground path and the half drain path. The Quine-McCluskey algorithm converts all portions having a turn-on state in the pull-up/pull-down tables into a minterm canonical expression. The converted minterms are reduced through a repetitive merging process, such that a sum of one or more products (SOP) is generated.

Next, in operation 303, a SOP that optimizes a ternary logic circuit is selected through SOP optimization. Last, in operation 304, an appropriate transistor may be mapped using the selected SOP.

Figure 4:
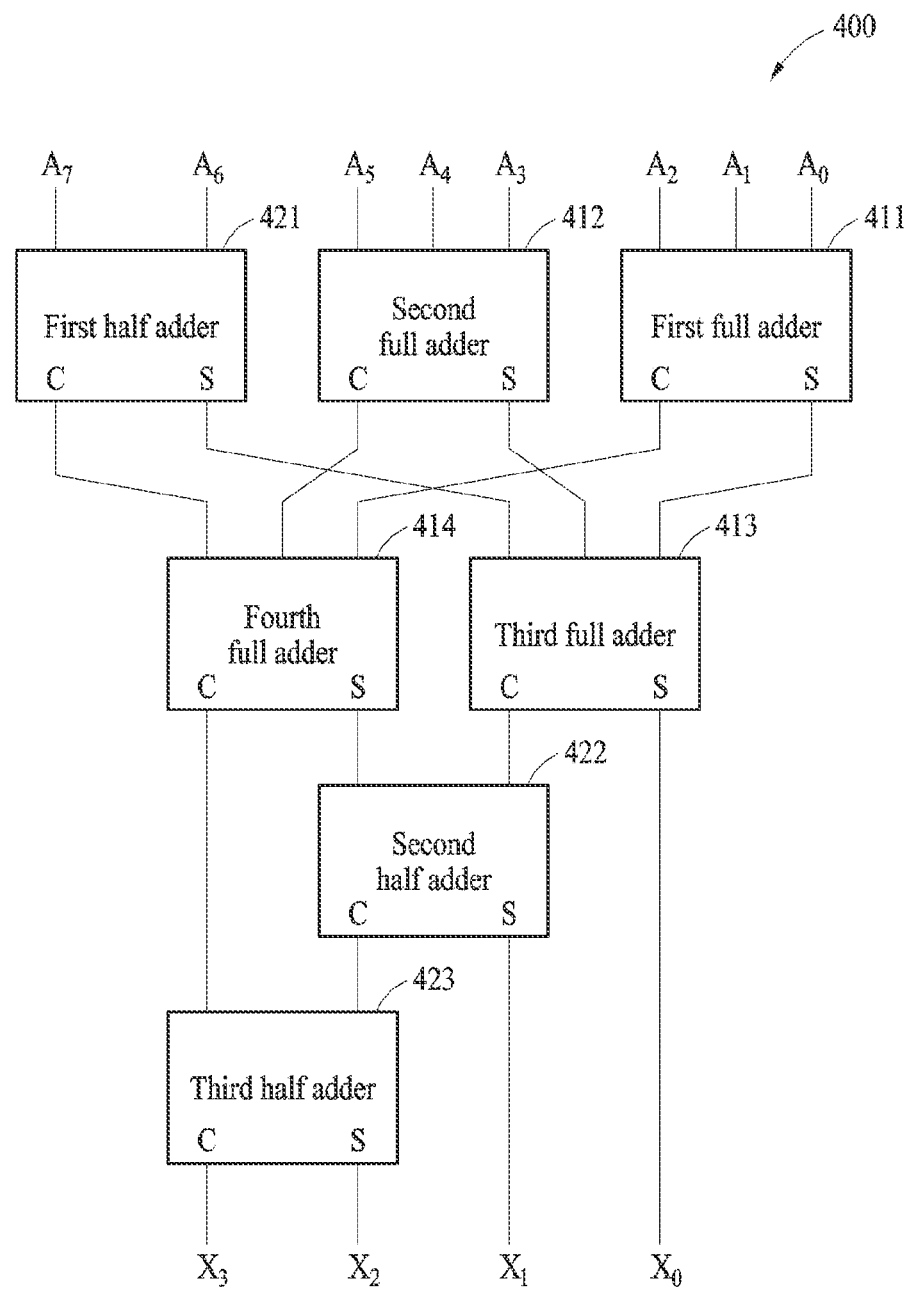
FIG. 4 illustrates a structure of an adder circuit according to an example embodiment.

FIG. 4 illustrates a structure of an adder circuit according to an example embodiment.

Hereinafter, a logic gate designed with an unbalanced ternary logic circuit of a ternary logic circuit and a binary logic circuit will be described. An adder circuit may receive a plurality of input signals. For example, the adder circuit may receive eight, ten, or twelve input signals. Hereinafter, an adder circuit 400 that receives eight input signals will be described.

The adder circuit 400 may include a first full adder 411, a second full adder 412, and a first half adder 421. The first full adder 411 may receive three input signals (e.g., $A_0$, $A_1$, and $A_2$) among the eight input signals applied to the adder circuit 400. The second full adder 412 may receive three other input signals (e.g., $A_3$, $A_4$, and $A_5$). The first half adder 421 may receive the other two input signals (e.g., $A_6$ and $A_7$). An adder is a logic circuit that performs an addition operation, a full adder is a logic circuit in an adder, the logic circuit to which three input signals are applied, and a half adder is a logic circuit in an adder, the logic circuit to which two input signals are applied. Voltages of the input signals applied to the adder circuit 400 may be one of drain voltages $V_{DD}$, half drain voltages $V_{DD}/2$, and ground voltages GND. For example, the drain voltage may be 0.9 V, and the half drain voltage may be 0.45 V, and the ground voltage may be 0 V.

The adder circuit 400 may further include a third full adder 413 that receives a sum output signal of the first full adder 411, a sum output signal of the second full adder 412, and a sum output signal of the first half adder 421. The adder circuit 400 may further include a fourth full adder 414 that receives a carry output signal of the first full adder 411, a carry output signal of the second full adder 412, and a carry output signal of the first half adder 421. The adder circuit 400 may further include a second half adder 422 that receives a carry output signal of the third full adder 413 and a sum output signal of the fourth full adder 414. The adder circuit 400 may further include a third half adder 423 that receives a carry output signal of the second half adder 422 and a carry output signal of the fourth full adder 414. The third full adder 413, the second half adder 422, and the third half adder 423 in the adder circuit 400 may output voltage signals corresponding to a sum of logical values indicated by input signals applied to the first full adder 411, the second full adder 412, and the first half adder 421. The adder circuit 400 may output a sum output signal (e.g., $X_0$) of the third full adder 413, a sum output signal (e.g., $X_1$) of the second half adder 422, and a sum output signal (e.g., $X_2$) and a carry output signal (e.g., $X_3$) of the third half adder 423. Although it will be described later, the adder circuit 400 may be used to implement a ternary adder circuit and a ternary averager circuit.

Figure 5:
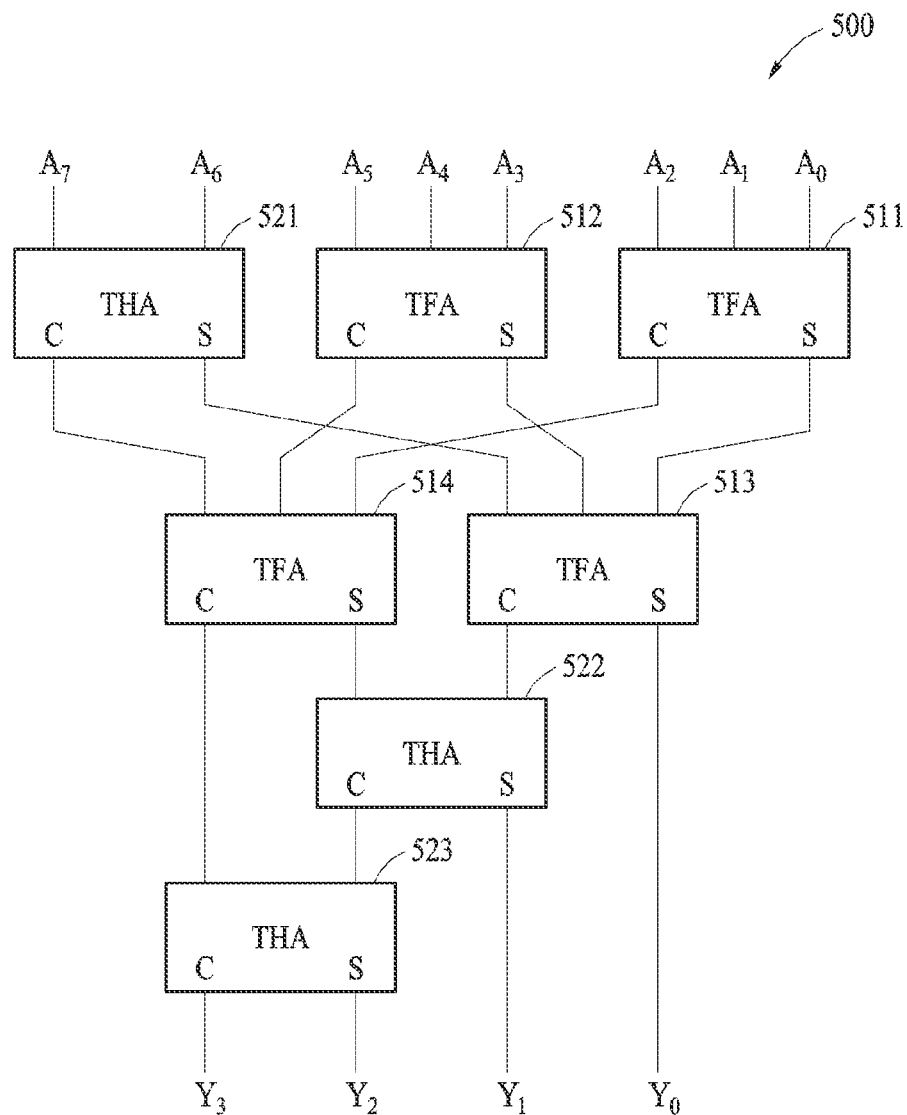
FIG. 5 illustrates a structure of a ternary adder circuit according to an example embodiment.

FIG. 5 illustrates a structure of a ternary adder circuit according to an example embodiment.

Hereinafter, a structure of a ternary adder circuit designed based on the structure of the adder circuit 400 of FIG. 4 will be described. The following Equation 2 shows a function expression implemented by the ternary adder circuit.

$$sum_i = \sum_{m=0}^{i-1} x_m (\text{base } 3) \qquad \text{[Equation 2]}$$

In Equation 2, i denotes the number of input signals received by the adder circuit. Hereinafter, a ternary adder circuit 500 to which eight input signals are applied will be described.

A first full adder 511, a second full adder 512, a third full adder 513, and a fourth full adder 514 in the ternary adder circuit 500 may be all ternary full adders (TFAs). A first half adder 521, a second half adder 522, and a third half adder 523 in the ternary adder circuit 500 may be all ternary half adders (THAs). A TFA may perform an operation according to a truth table described in Table 4 below.

TABLE 4

| $I_1$ | $I_2$ | $I_3$ | C | S | $I_1$ | $I_2$ | $I_3$ | C | S | $I_1$ | $I_2$ | $I_3$ | C | S |
|---|---|---|---|---|---|---|---|---|---|---|---|---|---|---|
| 0 | 0 | 0 | 0 | 0 | 1 | 0 | 0 | 0 | 1 | 2 | 0 | 0 | 0 | 2 |
| 0 | 0 | 1 | 0 | 1 | 1 | 0 | 1 | 0 | 2 | 2 | 0 | 1 | 1 | 0 |
| 0 | 0 | 2 | 0 | 2 | 1 | 0 | 2 | 1 | 0 | 2 | 0 | 2 | 1 | 1 |
| 0 | 1 | 0 | 0 | 1 | 1 | 1 | 0 | 0 | 2 | 2 | 1 | 0 | 1 | 0 |
| 0 | 1 | 1 | 0 | 2 | 1 | 1 | 1 | 1 | 0 | 2 | 1 | 1 | 1 | 1 |
| 0 | 1 | 2 | 1 | 0 | 1 | 1 | 2 | 1 | 1 | 2 | 1 | 2 | 1 | 2 |
| 0 | 2 | 0 | 0 | 2 | 1 | 2 | 0 | 1 | 0 | 2 | 2 | 0 | 1 | 1 |
| 0 | 2 | 1 | 1 | 0 | 1 | 2 | 1 | 1 | 1 | 2 | 2 | 1 | 1 | 2 |
| 0 | 2 | 2 | 1 | 1 | 1 | 2 | 2 | 1 | 2 | 2 | 2 | 2 | 2 | 0 |

In Table 4 above, $I_1$, $I_2$, and $I_3$ denote input signals applied to the TFA, S denotes a sum output signal that is output by the TFA, and C denotes a carry output signal that is output by the TFA. In Table 4, a ground voltage GND indicates a logical value "0", a half drain voltage VDD/2 indicates a logical value "1", and a drain voltage VDD indicates a logical value "2".

A THA may perform an operation according to a truth table described in Table 5 below.

TABLE 5

| $I_1$ | $I_2$ | C | S |
|---|---|---|---|
| 0 | 0 | 0 | 0 |
| 0 | 1 | 0 | 1 |
| 0 | 2 | 0 | 2 |
| 1 | 0 | 0 | 1 |
| 1 | 1 | 0 | 2 |
| 1 | 2 | 1 | 0 |
| 2 | 0 | 0 | 2 |
| 2 | 1 | 1 | 0 |
| 2 | 2 | 1 | 1 |

The ternary adder circuit 500 may output a sum output signal $Y_0$ of the third full adder 513, a carry output signal $Y_1$ of the second half adder 522, and a sum output signal $Y_2$ and a carry output signal $Y_3$ of the third half adder 523. A combination of logical values indicated by the output signals of the ternary adder circuit 500 is the same as a ternary expression of the sum of logical values indicated by the input signals applied to the ternary adder circuit 500. For example, a ternary value $Y_3Y_2Y_1Y_{0(3)}$ of a combination of the logical values indicated by the output signals of the ternary adder circuit 500 is equal to the sum of logical values indicated by the input signals $A_0$ to $A_7$ applied to the ternary adder circuit 500. In other words, a trit sequence in which the logical values indicated by the output signals of the ternary adder circuit 500 are combined sequentially may be a ternary expression of the sum of the logical values indicated by the input signals $A_0$ to $A_7$.

Figure 6A:
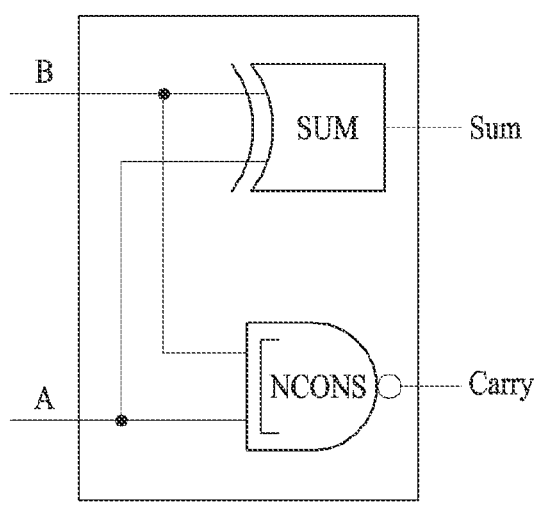
FIGS. 6A and 6B illustrate gate-level designs of ternary logic gates.
Figure 6B:
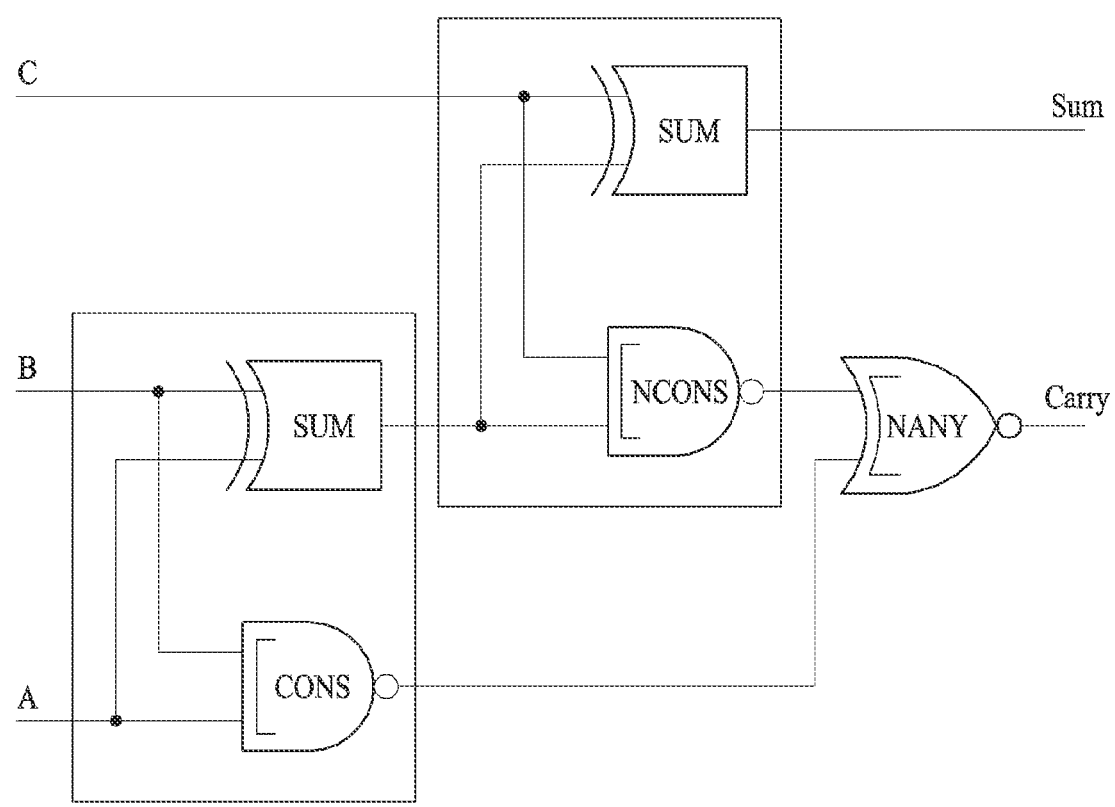

FIGS. 6A and 6B illustrate gate-level designs of ternary logic gates. In detail, FIG. 6A illustrates a gate-level design of an unbalanced THA, and FIG. 6B illustrates a gate-level design of an unbalanced TFA. The unbalanced TFA may include two THAs and a single NANY gate.

Figure 7A:
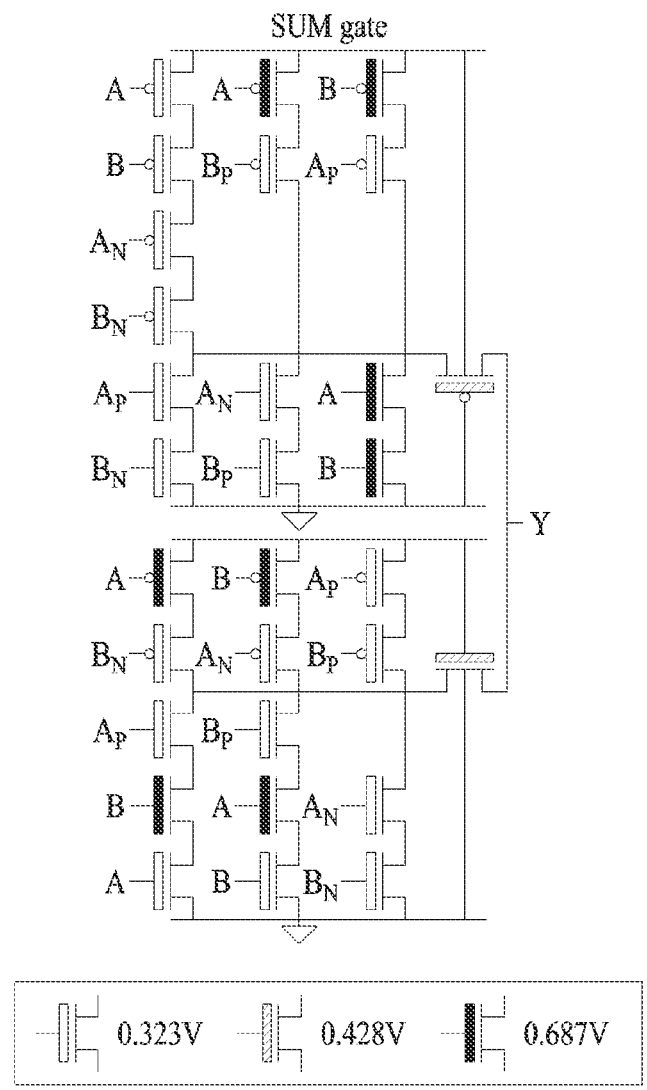
FIGS. 7A to 7C illustrate transistor-level designs of ternary logic gates in an unbalanced ternary logic.
Figure 7B:
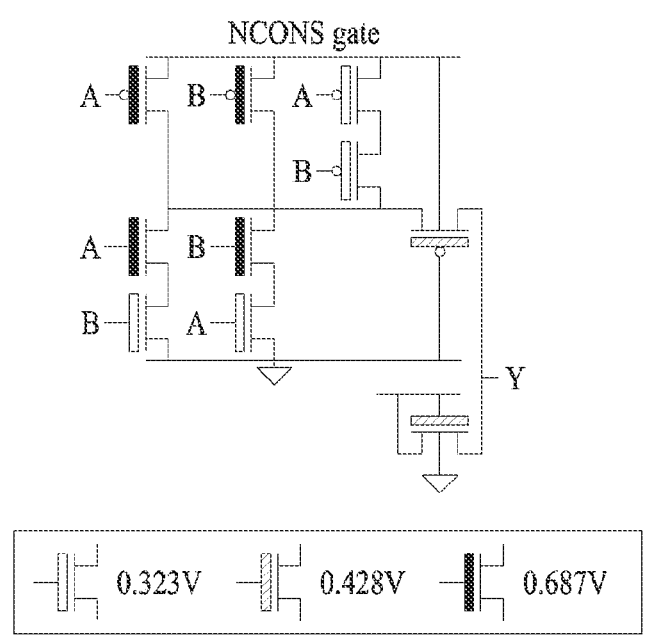
Figure 7C:
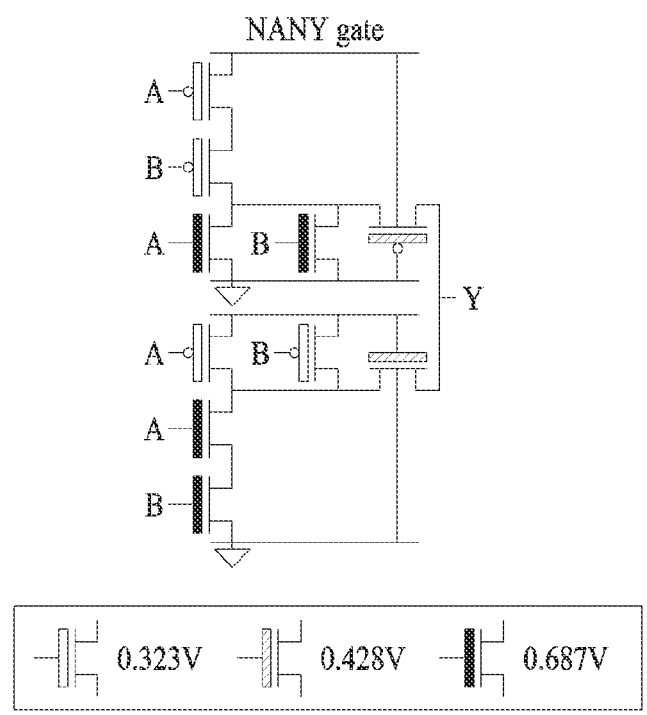

FIGS. 7A to 7C illustrate transistor-level designs of ternary logic gates in an unbalanced ternary logic. In detail, FIG. 7A is a transistor-level design of a ternary sum gate (hereinafter, a "SUM gate") in an unbalanced ternary logic, FIG. 7B is a transistor-level design of an NCONS gate in the unbalanced ternary logic, and FIG. 7C is a transistor-level design of an NANY gate in the unbalanced ternary logic. The SUM gate, the NCONS gate, and the NANY gate in the unbalanced ternary logic may perform operations according to a truth table described in Table 6 below.

TABLE 6

| $I_1$ | $I_2$ | SUM | NCONS | NANY |
|---|---|---|---|---|
| 0 | 0 | 0 | 2 | 2 |
| 0 | 1 | 1 | 2 | 2 |
| 0 | 2 | 2 | 2 | 1 |
| 1 | 0 | 1 | 2 | 2 |
| 1 | 1 | 2 | 2 | 2 |
| 1 | 2 | 0 | 1 | 1 |
| 2 | 0 | 2 | 2 | 1 |
| 2 | 1 | 0 | 1 | 1 |
| 2 | 2 | 1 | 1 | 0 |

In Table 6 described above, the SUM gate (ternary sum gate) may be a gate that outputs an output signal corresponding to a remainder of the sum of logical values indicated by received input signals, divided by "3".

Hereinafter, a method of designing a SUM gate among ternary logic gates at a transistor level will be described. Table 7 is a pull-up/pull-down table generated from a truth table for a SUM gate in an unbalanced ternary logic.

TABLE 7

| I1 | I2 | VDD/Gnd Up | VDD/Gnd Down | Half-VDD Up | Half-VDD Down |
|---|---|---|---|---|---|
| 0 | 0 | OFF | ON | OFF | X |
| 0 | 1 | OFF | OFF | ON | ON |
| 0 | 2 | ON | OFF | X | OFF |
| 1 | 0 | OFF | OFF | ON | ON |
| 1 | 1 | ON | OFF | X | OFF |
| 1 | 2 | OFF | ON | OFF | X |
| 2 | 0 | ON | OFF | X | OFF |
| 2 | 1 | OFF | ON | OFF | X |
| 2 | 2 | OFF | OFF | ON | ON |

Minimization for designing a ternary logic circuit with a minimum number of transistors may be performed using the generated pull-up/pull-down table. However, before the minimization, don't-care terms (portions marked with X) present in the pull-up/pull-down table of a half drain path need to be processed. Each don't-care term may be replaced with on or off. To synthesize a circuit to the optimum for an arbitrary truth table, all combinations in which don't-care terms are substituted for on or off should be considered. Accordingly, all possible pull-up/pull-down tables in which a pull-up/pull-down table of a half drain path includes only on or off are generated. The pull-up/pull-down tables may be all optimized through a proposed minimization algorithm, and accordingly, a single pull-up/pull-down table with the minimum number of transistors may be selected. The following Table 8 shows a pull-up/pull-down table in which don't-care terms are processed to have a minimum number of transistors for a two-input SUM gate.

TABLE 8

| $I_1$ | $I_2$ | VDD/Gnd Up | VDD/Gnd Down | Half-VDD Up | Half-VDD Down |
|---|---|---|---|---|---|
| 0 | 0 | OFF | ON | OFF | ON |
| 0 | 1 | OFF | OFF | ON | ON |

TABLE 8-continued

| $I_1$ | $I_2$ | VDD/Gnd Up | VDD/Gnd Down | Half-VDD Up | Half-VDD Down |
|---|---|---|---|---|---|
| 0 | 2 | ON  | OFF | ON  | OFF |
| 1 | 0 | OFF | OFF | ON  | ON  |
| 1 | 1 | ON  | OFF | OFF | OFF |
| 1 | 2 | OFF | ON  | OFF | OFF |
| 2 | 0 | ON  | OFF | ON  | OFF |
| 2 | 1 | OFF | ON  | OFF | OFF |
| 2 | 2 | OFF | OFF | ON  | ON  |

Next, minimization may be performed using the Quine-McCluskey algorithm. When the pull-up/pull-down table in Table 8 is provided as an input of the algorithm, the minimization process is performed, such that SOPs for pull-up/pull-down networks of a drain-ground path are A0B2+A1B1+A2B0 and A0B0+A1B2+A2B1, and SOPs for pull-up/pull-down networks of a half drain path are A0(B1+B2)+A2B2+(A1+A2)B0 and A2B2+A0(B0+B1)+(A0+A1)B0.

The SOP optimization operation is an operation of selecting an optimal SOP when a plurality of minimization SOPs are generated by the Quine-McCluskey algorithm. In the SOP optimization operation, an optimal SOP is determined in consideration of two factors. First, it is to minimize the number of transistors in a network. Second, it is to minimize the transmission delay of a network. A logic gate may be configured to reduce a transmission delay by minimizing the number of CNTFETs having a chiral vector (8, 0). For example, it is assumed that a predetermined SOP is an optimal SOP (OSOP). To verify whether the predetermined SOP is an optimal SOP, all the other SOPs except for the predetermined SOP are compared to the OSOP. For each SOP, the number of transistors required to construct a network is calculated. The number of transistors calculated for each SOP is compared to the number of transistors of the OSOP. Based on the comparison result, an SOP requiring the fewest transistors is determined to be the OSOP. If the number of transistors of a current OSOP is less than the number of transistors required for an SOP compared to the current OSOP, the current OSOP is maintained as the OSOP. By selecting an SOP requiring fewer transistors as an OSOP, it is possible to reduce the power consumption and required area of the circuit and maximize the speed thereof.

Next, when the number of required transistors is the same, the number of CNTFETs having a chiral vector (8, 0) may be reduced to alleviate the transmission delay of the circuit. In constructing a network, two types of CNTFETs having chiral vectors of (8, 0) and (17, 0) may be used. A CNTFET having a chiral vector of (13, 0) may be used to construct a first pass transistor and a second pass transistor. A chiral vector is inversely proportional to a threshold voltage of the CNTFET. Thus, a threshold voltage of a CNTFET having a chiral vector of (8, 0) is greater than a threshold voltage of a CNTFET having a chiral vector of (17, 0). Therefore, a drain current of the CNTFET having a chiral vector of (8, 0) flows less. Consequently, since the transmission delay of the logic gate increases as the drain current decreases, the transmission delay may be alleviated by reducing the number of CNTFETs having a chiral vector of (8, 0) in the case of constructing a network with the same number of transistors.

The transistor mapping operation is an operation of constructing a network by connecting appropriate devices based on a static gate design after the SOP optimization operation. For each product term of an SOP, a drain node of a predetermined transistor and a source node of a subsequent transistor are connected to connect the two transistors in series. Similarly, the SOP may be configured by connecting generated product models in parallel. In a pull-up network, transistors may be connected in parallel by connecting source nodes of the top transistor of the product models and connecting drain nodes of the bottom transistors. The logic gate may be synthesized by appropriately connecting the nodes of the networks, as shown in FIG. 2. In the manner described above, each ternary logic gate may be designed using transistors.

Figure 8:
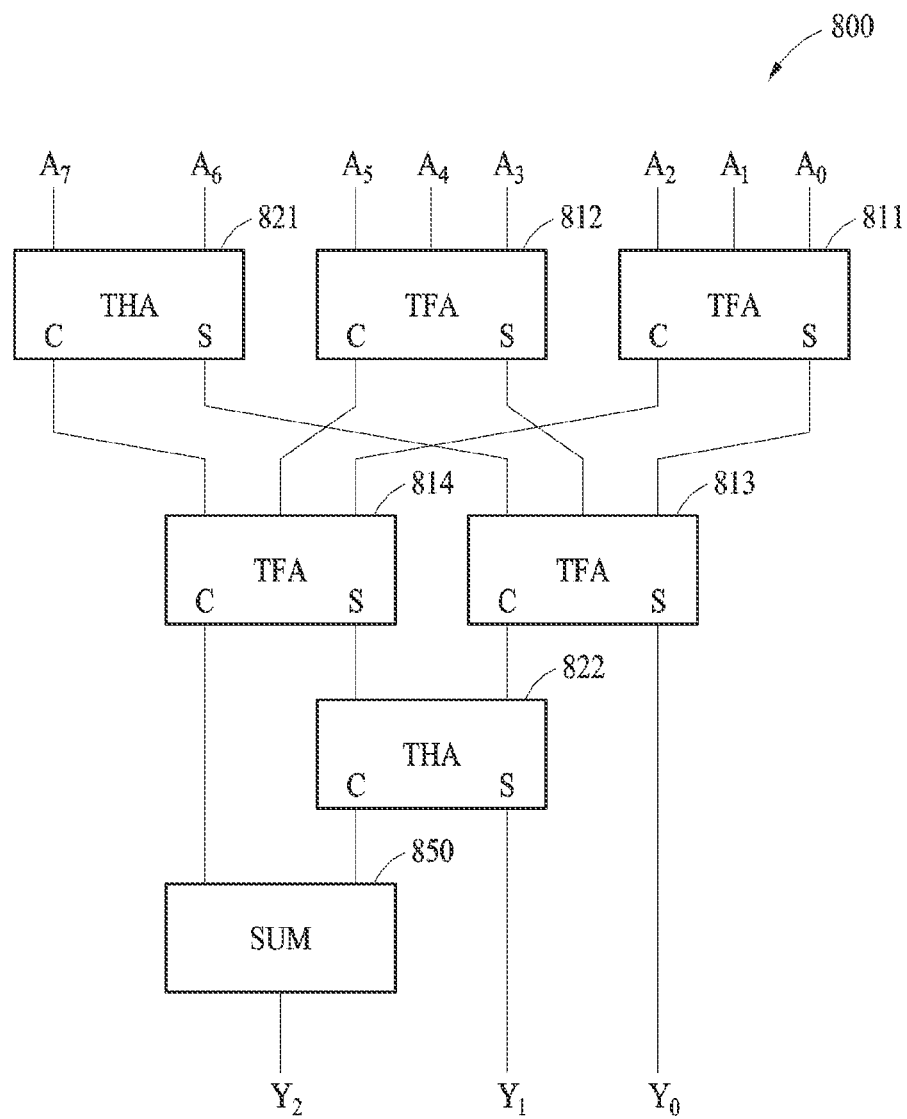
FIG. 8 illustrates a structure of a modified ternary adder circuit according to an example embodiment.

FIG. 8 illustrates a structure of a modified ternary adder circuit according to an example embodiment.

A modified ternary adder circuit 800 has a structure similar to that of the ternary adder circuit 500. The modified ternary adder circuit 800 may have a structure in which the third half adder 523 of the ternary adder circuit 500 is replaced with a SUM gate 850.

Eight input signals may be applied to the modified ternary adder circuit 800. The modified ternary adder circuit 800 may include a first TFA 811, a second TFA 812, and a first THA 821. The first TFA 811 may receive three input signals (e.g., $A_0$, $A_1$, and $A_2$) among the eight input signals applied to the circuit 800. The second TFA 812 may receive three other input signals (e.g., $A_3$, $A_4$, and $A_5$). The first THA 821 may receive the other two input signals (e.g., $A_6$ and $A_7$). The modified adder circuit 800 may further include a third TFA 813 that receives a sum output signal of the first TFA 811, a sum output signal of the second TFA 812, and a sum output signal of the first THA 821. The modified adder circuit 800 may further include a fourth TFA 814 that receives a carry output signal of the first TFA 811, a carry output signal of the second TFA 812, and a carry output signal of the first THA 821. The modified adder circuit 800 may further include a second THA 822 that receives a carry output signal of the third TFA 813 and a sum output signal of the fourth TFA 814. The modified adder circuit 800 may further include the SUM gate 850 that receives a carry output signal of the second THA 822 and a carry output signal of the fourth TFA 814. The third TFA 813, the second THA 822, and the SUM gate 850 in the modified adder circuit 800 may output voltage signals corresponding to a sum of logical values indicated by input signals applied to the first TFA 811, the second TFA 812, and the first THA 821.

In detail, since the first THA 821 receives two input signals (e.g., $A_6$ and $A_7$), the carry output signal of the first THA 821 may be one of a half drain voltage $V_{DD}/2$ indicating a logical value "1" and a ground voltage GND indicating a logical value "0". The fourth TFA 814 receives three input signals, but the carry output signal of the first THA 821 is a half drain voltage indicating a logical value "1" or a ground voltage indicating a logical value "0". Thus, the carry output signal of the fourth TFA 814 may also be one of a half drain voltage indicating a logical value "1" and a ground voltage GND indicating a logical value "0". In addition, since the second THA 822 also receives two input signals, the carry output signal of the second THA 822 may be one of a half drain voltage $V_{DD}/2$ indicating a logical value "1" and a ground voltage GND indicating a logical value "0". As a result, both the carry output signal of the fourth TFA 814 and the carry output signal of the second THA 822 are one of drain voltages indicating a logical value "1" and ground voltages indicating a logical value "0". Thus, a carry does not occur for a ternary expression of the sum of logical values indicated by the input signals applied to the SUM gate 850. Accordingly, the modified ternary adder circuit 800 may implement a ternary adder circuit as the SUM gate 850, instead of the third half adder 523 of the ternary adder circuit 500, thereby expressing the sum of logical values indicated by the input signals as an output signal. The modified ternary adder circuit 800 may be implemented with fewer transistors than the ternary adder circuit 500 because the SUM gate 850 may be implemented with fewer transistors compared to the third half adder 523.

Figure 9A:
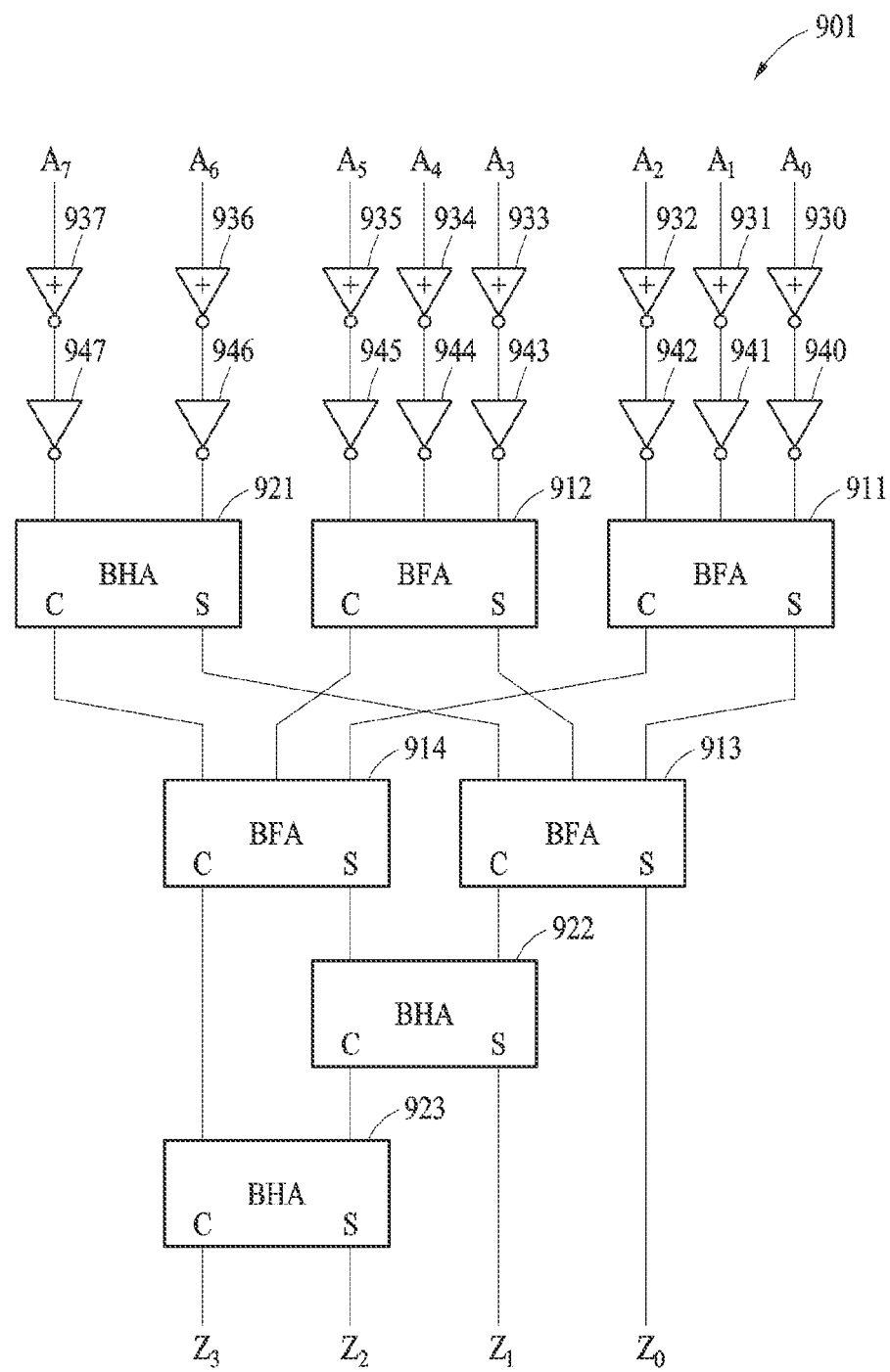
FIGS. 9A to 9C illustrate methods of designing a ternary averager circuit to output a voltage corresponding to an average value of logical values indicated by a plurality of input signals applied thereto.
Figure 9B:
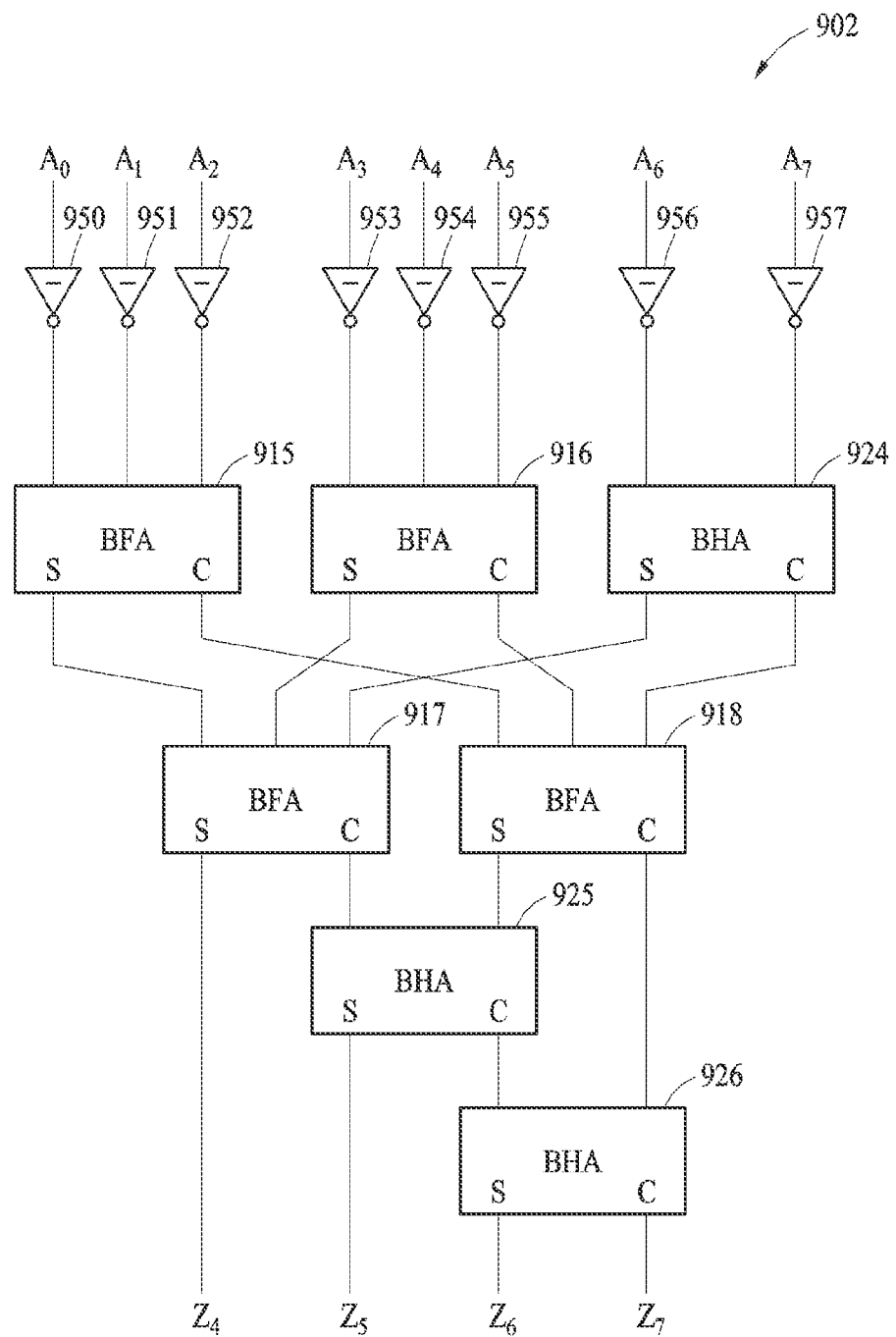
Figure 9C:
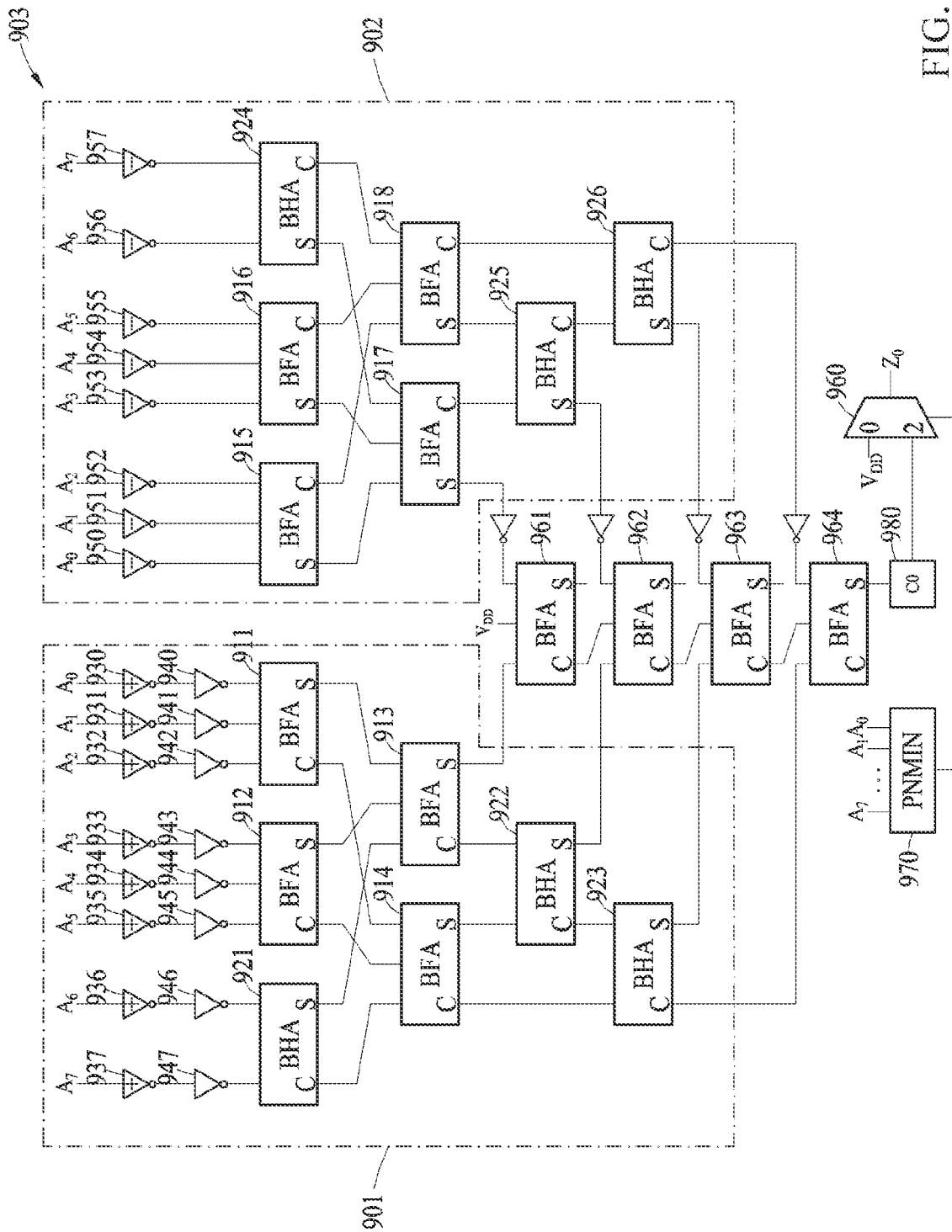

FIGS. 9A to 9C illustrate methods of designing a ternary averager circuit to output a voltage corresponding to an average value of logical values indicated by a plurality of input signals applied thereto.

A ternary averager circuit may be designed based on the structure of the adder circuit 400 of FIG. 4. The ternary averager circuit may perform an operation of obtaining an average value of ternary logical values indicated by input signals in the form of an integer. In an unbalanced ternary logic, a drain voltage $V_{DD}$ indicates a logical value "2", a half drain voltage $V_{DD}/2$ indicates a logical value "1", and a ground voltage GND indicates a logical value "0". The ternary averager circuit may calculate the average value of the logical values indicated by the plurality of input signals in the form of an integer and output a voltage corresponding to the calculated average value. The following Equation 3 shows a function expression implemented by the ternary averager circuit.

$$avg_i = \left\lfloor \frac{1}{i} \sum_{m=0}^{i-1} x_m \right\rfloor (\text{base } 3) \quad [\text{Equation 3}]$$

In Equation 3, i denotes the number of input signals received by the averager circuit. Hereinafter, a ternary averager circuit 903 to which eight input signals are applied will be described. The ternary averager circuit 903 may compare the number of drain voltages $V_{DD}$ and the number of ground voltages GND among the input signals applied thereto and output a voltage corresponding to an average value of ternary logical values indicated by the input signals. Specifically, when the plurality of input signals applied thereto are all drain voltages $V_{DD}$, the ternary averager circuit 903 may output a drain voltage $V_{DD}$ corresponding to "2", which is the average value of logic values indicated by the input signals. When at least one of the plurality of input signals applied thereto is not a drain voltage and the number of drain voltages among the plurality of input signals is greater than or equal to the number of ground voltages, the ternary averager circuit 903 may output a half drain voltage $V_{DD}/2$ corresponding to "1", which is an average value of logic values indicated by the plurality of input signals. When at least one of the plurality of input signals applied thereto is not a drain voltage and the number of drain voltages among the plurality of input signals is less than the number of ground voltages, the ternary averager circuit 903 may output a ground voltage GND corresponding to "0", which is an average value of logic values indicated by the plurality of input signals. Hereinafter, the structure of the ternary averaging circuit 903 will be described further.

FIG. 9A illustrates a first count circuit 901 that counts the number of drain voltages among input signals applied to a ternary averager circuit.

The first count circuit 901 designed based on the structure of the adder circuit 400 of FIG. 4 may count the number of drain voltages $V_{DD}$ among the input signals applied to the ternary averager circuit. A plurality of input signals may be applied to the first count circuit 901. A first full adder 911, a second full adder 912, a third full adder 913, and a fourth full adder 914 in the first count circuit 901 may be binary full adders (BFAs). A first half adder 921, a second half adder 922, and a third half adder 923 in the first count circuit 901 may be binary half adders (BHAs). Hereinafter, an n-th full adder will be referred to as an n-th BFA, and an m-th half adder will be referred to as an m-th BHA.

The first count circuit 901 may further include a positive ternary inverter (PTI), and a binary inverter connected between the PTI and one of the first BFA 911, the second BFA 912, and the first BHA 921. More specifically, the first count circuit 901 may further include eight PTIs 930 to 937, and eight binary inverters 940 to 947 respectively connected to the eight PTIs 930 to 937. A PTI and a negative ternary inverter (NTI) may perform operations according to a truth table described in Table 9 below. In Table 9, a ground voltage GND indicates a logical value "0", a half drain voltage $V_{DD}/2$ indicates a logical value "1", and a drain voltage $V_{DD}$ indicates a logical value "2".

TABLE 9

| $I_1$ | PTI | NTI |
|---|---|---|
| 0(GND) | 2 | 2 |
| 1($V_{DD}/2$) | 2 | 0 |
| 2($V_{DD}$) | 0 | 0 |

A binary inverter may perform an operation according to a truth table described in Table 10 below, a BFA may perform an operation according to a truth table described in Table 11 below, and a BHA may perform an operation according to a truth table described in Table 12 below. In Tables 10, 11, and 12, a drain voltage $V_{DD}$ indicates a logical value "1", and a ground voltage GND indicates a logical value "0". It is assumed that a half drain voltage is not applied as an input signal to the binary inverter, the BFA, and the BHA.

TABLE 10

| $I_1$ | Binary inverter |
|---|---|
| 0 | 2 |
| 2 | 0 |

TABLE 11

| $I_1$ | $I_2$ | $I_3$ | C | S |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

TABLE 12

| $I_1$ | $I_2$ | C | S |
|---|---|---|---|
| 0 | 0 | 0 | 0 |
| 0 | 1 | 0 | 1 |
| 1 | 0 | 0 | 1 |
| 1 | 1 | 1 | 0 |

Referring to Table 9, the PTIs 930 to 937 in the first count circuit 901 output ground voltages GND only when receiving drain voltages $V_{DD}$ as the input signals $A_0$ to $A_7$, respectively, and output drain voltages $V_{DD}$ when receiving one of half drain voltages $V_{DD}/2$ and ground voltages GND as the input signals. The output voltages of the PTIs 930 to 937 are applied to the binary inverters 940 to 947, respectively.

Referring to Table 10, each of the binary inverters 940 to 947 outputs a drain voltage when receiving a ground voltage, and outputs a ground voltage when receiving a drain voltage. As a result, each of a PTI and a binary inverter that are connected to each other outputs a drain voltage only when receiving a drain voltage, and outputs a ground voltage when receiving one of a half drain voltage and a ground voltage.

The first BFA 911, the second BFA 912, and the first BHA 921 may receive signals output through the PTIs and the binary inverters. Each of the BFA and the BHA outputs a carry output signal and a sum output signal by determining that a logical value "0" is input when receiving a ground voltage GND and determining that a logical value "1" is input when receiving a drain voltage $V_{DD}$.

The third BFA 913 may receive sum output signals of the first BFA 911, the second BFA 912, and the first BHA 921. The fourth BFA 914 may receive carry output signals of the first BFA 911, the second BFA 912, and the first BHA 921. The second BHA 922 may receive a carry output signal of the third BFA 913 and a sum output signal of the fourth BFA 914. The third BHA 923 may receive a carry output signal of the second BHA 922 and a carry output signal of the fourth BFA 914.

The first count circuit 901 may output a sum output signal $Z_0$ of the third BFA 913, a sum output signal $Z_1$ of the second BHA 922, and a sum output signal $Z_2$ and a carry output signal $Z_3$ of the third BHA 923. A combination of logical values indicated by the output signals of the first count circuit 901 is the same as a binary expression of the number of drain voltages among the input signals applied to the first count circuit 901. For example, a binary value $Z_3Z_2Z_1Z_{0(2)}$ of the combination of the logical values indicated by the output signals of the first count circuit 901 is equal to the number of drain voltages among the input signals applied to the first count circuit 901. In other words, a bit sequence in which the logical values indicated by the output signals of the first count circuit 901 are combined sequentially may be a binary expression of the number of drain voltages among the input signals.

FIG. 9B illustrates a second count circuit 902 that counts the number of ground voltages among input signals applied to a ternary averager circuit.

The second count circuit 902 designed based on the structure of the adder circuit 400 of FIG. 4 may count the number of ground voltages GND among the input signals applied to the ternary averager circuit. A plurality of input signals may be applied to the second count circuit 902. The second count circuit 902 may include a fifth full adder 915, a sixth full adder 916, a seventh full adder 917, and an eighth full adder 918, where the full adders may be all BFAs. The second count circuit 902 may further include a fourth half adder 924, a fifth half adder 925, and a sixth half adder 926, where the half adders may be all BHAs. The second count circuit 902 may further include eight NTIs 950 to 957.

Referring to Table 9, the NTIs 950 to 957 in the second count circuit 902 output drain voltages $V_{DD}$ only when receiving ground voltages GND as the input signals $A_0$ to $A_7$, respectively, and output ground voltages GND when receiving one of half drain voltages $V_{DD}/2$ and drain voltage $V_{DD}$ as the input signals.

The fifth BFA 915, the sixth BFA 916, and the fourth BHA 924 may receive signals output through the NTIs. Each of the BFA and the BHA outputs a carry output signal and a sum output signal by determining that a logical value "0" is input when receiving a ground voltage GND and determining that a logical value "1" is input when receiving a drain voltage $V_{DD}$.

The seventh BFA 917 may receive sum output signals of the fifth BFA 915, the sixth BFA 916, and the fourth BHA 924. The eighth BFA 918 may receive carry output signals of the fifth BFA 915, the sixth BFA 916, and the fourth BHA 924. The fifth BHA 925 may receive a carry output signal of the seventh BFA 917 and a sum output signal of the eighth BFA 918. The sixth BHA 926 may receive a carry output signal of the eighth BFA 918 and a carry output signal of the fifth BHA 925.

The second count circuit 902 may output a sum output signal $Z_4$ of the seventh BFA 917, a sum output signal $Z_5$ of the fifth BHA 925, and a sum output signal $Z_6$ and a carry output signal $Z_7$ of the sixth BHA 926. A combination of logical values indicated by the output signals of the second count circuit 902 is the same as a binary expression of the number of ground voltages among the input signals applied to the second count circuit 902. For example, a binary value $Z_7Z_6Z_5Z_{4(2)}$ of the combination of the logical values indicated by the output signals of the second count circuit 902 is equal to the number of ground voltages among the input signals applied to the second count circuit 902. In other words, a bit sequence in which the logical values indicated by the output signals of the second count circuit 902 are combined sequentially may be a binary expression of the number of ground voltages among the input signals.

FIG. 9C illustrates the ternary averager circuit 903 according to an example embodiment.

The ternary averager circuit 903 may include the first count circuit 901 and the second count circuit 902. The ternary averager circuit 903 may receive input signals $A_0$ to $A_7$ through the first count circuit 901 and receive the input signals $A_0$ to $A_7$ through the second count circuit 902. Although it will be described later, the ternary averager circuit 903 may receive the input signals $A_0$ to $A_7$ through the PNMIN gate. As described above, the first count circuit 901 may count the number of drain voltages among the input signals, and the second count circuit 902 may count the number of ground voltages among the input signals. Hereinafter, a circuit structure for comparing the number of drain voltages counted by the first count circuit 901 with the number of ground voltages counted by the second count circuit 902 will be described.

The ternary averager circuit 903 may further include a ninth BFA 961 that receives a sum output signal of the third BFA 913, an inverting signal for a sum output signal of the seventh BFA 917, and a drain voltage. The ternary averager circuit 903 may further include a tenth BFA 962 that receives a sum output signal of the second BHA 922, an inverting signal for a sum output signal of the fifth BHA 925, and a carry output signal of the ninth BFA 931. The ternary averager circuit 903 may further include an eleventh BFA 963 that receives a sum output signal of the third BHA 923, an inverting signal for a sum output signal of the sixth BHA 926, and a carry output signal of the tenth BFA 962. The adder circuit 400 may further include a twelfth BFA 964 that receives a carry output signal of the third BHA 923, an inverting signal for a carry output signal of the sixth BHA 926, and a carry output signal of the eleventh BFA 963.

The twelfth BFA 964 may compare the number of drain voltages, $Z_3Z_2Z_1Z_{0(2)}$, counted by the first count circuit 901 with the number of ground voltages, $Z_7Z_6Z_5Z_{4(2)}$, counted by the second count circuit 902, and thereby output a ground voltage GND indicating a logical value "0" as a sum output signal if the number of drain voltages is greater than or equal to the number of ground voltages and output a drain voltage $V_{DD}$ indicating a logical value "1" as the sum output signal if the number of drain voltages is less than the number of ground voltages.

Furthermore, the ternary averager circuit 903 may further include a C0 gate 980 that receives a sum output signal of the twelfth BFA 964, and a PNMIN gate 970 that receives the eight input signals $A_0$ to $A_7$. The ternary averager circuit 903 may further include a multiplexer 960 that selectively outputs one of a drain voltage and an output signal of the C0 gate 980 received as input signals, based on an output signal of the PNMIN gate 970 received as a selected signal.

The C0 gate 980 may output a ground voltage when receiving one of a half drain voltage and a drain voltage, and output a half drain voltage when receiving a ground voltage. The C0 gate 980 is a ternary logic gate and may perform an operation according to a truth table described in Table 13 below. In Table 13, a ground voltage GND indicates a logical value "0", a half drain voltage $V_{DD}/2$ indicates a logical value "1", and a drain voltage $V_{DD}$ indicates a logical value "2".

TABLE 13

| $I_1$ | C0 |
|---|---|
| 0(GND) | 1 |
| 1($V_{DD}/2$) | 0 |
| 2($V_{DD}$) | 0 |

When the number of drain voltages among the input signals applied to the ternary averager circuit is greater than or equal to the number of ground voltages, the twelfth BFA 964 may output a ground voltage GND as the sum output signal. When a ground voltage GND is received as the sum output signal of the twelfth BFA 964, the C0 gate 980 may output a half drain voltage $V_{DD}/2$ indicating a ternary logical value "1".

When the number of drain voltages among the input signals applied to the ternary averager circuit is less than the number of ground voltages, the twelfth BFA 964 may output a drain voltage $V_{DD}$ as the sum output signal. When a drain voltage $V_{DD}$ is received as the sum output signal of the twelfth BFA 964, the C0 gate 980 may output a ground voltage GND indicating a ternary logical value "0".

The PNMIN gate 970 may output a drain voltage when a minimum voltage among the plurality of input signals applied is a ground voltage or a half drain voltage, and output a ground voltage when the minimum voltage among the plurality of input signals applied is a drain voltage. In other words, the PNMIN gate 970 may output a ground voltage indicating a logical value of "0" only when the plurality of input signals applied are all drain voltages, and output a drain voltage indicating a logical value "2" when at least one of the plurality of input signals applied is not a drain voltage.

The multiplexer 960 may receive the output signal of the PNMIN gate 970 as a selected input. When the output signal of the PNMIN gate 970 is a ground voltage indicating a logical value "0", the multiplexer 960 outputs a drain voltage $V_{DD}$ as an output signal $Z_8$ of the ternary averager circuit 903. The multiplexer 960 outputs the output signal of the C0 gate 980 as the output signal of the ternary averager circuit 903 when the output signal of the PNMIN gate 970 is a drain voltage indicating a logical value of "2".

In other words, when at least one of the input signals $A_0$ to $A_7$ is not a drain voltage, the ternary averager circuit 903 determines the output of the C0 gate to be the output of the ternary averager circuit 903 by applying a drain voltage indicating a logical value "2" from the PNMIN gate 970 to the multiplexer 960. Here, when the number of drain voltages among the input signals is greater than or equal to the number of ground voltages, the ternary averager circuit 903 determines a half drain voltage indicating a ternary logical value "1" output from the C0 gate 980 to be the output of the ternary averager circuit 903. When the number of drain voltages is less than the number of ground voltages, the ternary averager circuit 903 determines a ground voltage indicating a ternary logical value "0" output from the C0 gate 980 to be the output of the ternary averager circuit 903.

When the input signals $A_0$ to $A_7$ are all drain voltages, the ternary averager circuit 903 determines a drain voltage $V_{DD}$ indicating a ternary logical value "2" to be the output of the ternary averager circuit 903 by applying a ground voltage indicating a logical value "0" from the PNMIN gate 970 to the multiplexer 960.

As a result, the ternary averager circuit 903 may output a voltage corresponding to an average value of the ternary logical values indicated by the plurality of input signals applied.

The PTIs, the NTIs, the binary inverters, the BFAs, the BHAs, the C0 gate, and the PNMIN gate in the ternary averager circuit 903 may be designed at a transistor level through the pull-up/pull-down table generation, Quine-McCluskey algorithm application, SOP optimization, and transistor mapping operations proposed above.

The units described herein may be implemented using a hardware component, a software component and/or a combination thereof. A processing device may be implemented using one or more general-purpose or special-purpose computers, such as, for example, a processor, a controller and an arithmetic logic unit (ALU), a DSP, a microcomputer, an FPGA, a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, the processing device may include a plurality of processors, or a single processor and a single controller. In addition, different processing configurations are possible, such as parallel processors.

The software may include a computer program, a piece of code, an instruction, or some combination thereof, to independently or uniformly instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter.

The above-described devices may be configured to act as one or more software modules in order to perform the operations of the above-described examples, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A circuit comprising:
   a first full adder;
   a second full adder;
   a first half adder;
   a third full adder configured to receive a sum output signal of the first full adder, a sum output signal of the second full adder, and a sum output signal of the first half adder;
   a fourth full adder configured to receive a carry output signal of the first full adder, a carry output signal of the second full adder, and a carry output signal of the first half adder;
   a second half adder configured to receive a carry output signal of the third full adder and a sum output signal of the fourth full adder; and
   a third half adder configured to receive a carry output signal of the second half adder and a carry output signal of the fourth full adder,
   wherein the third full adder, the second half adder, and the third half adder are configured to output voltage signals corresponding to a sum of logical values indicated by input signals applied to the first full adder, the second full adder, and the first half adder,
   wherein the first full adder, the second full adder, the third full adder, and the fourth full adder are ternary full adders (TFAs), and
   wherein the first half adder, the second half adder, and the third half adder are ternary half adders (THAs).

2. A circuit comprising:
   a first full adder;
   a second full adder;
   a first half adder;
   a third full adder configured to receive a sum output signal of the first full adder, a sum output signal of the second full adder, and a sum output signal of the first half adder;
   a fourth full adder configured to receive a carry output signal of the first full adder, a carry output signal of the second full adder, and a carry output signal of the first half adder;
   a second half adder configured to receive a carry output signal of the third full adder and a sum output signal of the fourth full adder; and
   a third half adder configured to receive a carry output signal of the second half adder and a carry output signal of the fourth full adder,
   wherein the third full adder, the second half adder, and the third half adder are configured to output voltage signals corresponding to a sum of logical values indicated by input signals applied to the first full adder, the second full adder, and the first half adder,
   wherein the first full adder, the second full adder, the third full adder, and the fourth full adder are binary full adders (BFAs),
   wherein the first half adder, the second half adder, and the third half adder are binary half adders (BHAs), and
   wherein the circuit further comprises:
   a positive ternary inverter (PTI); and
   a binary inverter connected between the PTI and one of the first full adder, the second full adder, and the first half adder.

3. The circuit of claim 2, further comprising:
   a negative ternary inverter (NTI);
   a fifth BFA;
   a sixth BFA;
   a fourth BHA;
   a seventh BFA configured to receive a sum output signal of the fifth BFA, a sum output signal of the sixth BFA, and a sum output signal of the fourth BHA;
   an eighth BFA configured to receive a carry output signal of the fifth BFA, a carry output signal of the sixth BFA, and a carry output signal of the fourth BHA;
   a fifth BHA configured to receive a carry output signal of the seventh BFA and a sum output signal of the eighth BFA; and
   a sixth BHA configured to receive a carry output signal of the fifth BHA and a carry output signal of the eighth BFA.

4. The circuit of claim 3, further comprising:
   a ninth BFA configured to receive a sum output signal of the third full adder, an inverting signal for a sum output signal of the seventh BFA, and a drain voltage;
   a tenth BFA configured to receive a sum output signal of the second half adder, an inverting signal for a sum output signal of the fifth BHA, and a carry output signal of the ninth BFA;

an eleventh BFA configured to receive a sum output signal of the third half adder, an inverting signal for a sum output signal of the sixth BHA, and a carry output signal of the tenth BFA; and a twelfth BFA configured to receive a carry output signal of the third half adder, an inverting signal for a carry output signal of the sixth BHA, and a carry output signal of the eleventh BFA.

5. The circuit of claim 4, further comprising:

a C0 gate configured to receive a sum output signal of the twelfth BFA;

a PNMIN gate configured to receive a plurality of input signals; and a multiplexer configured to selectively output one of the drain voltage and an output signal of the C0 gate received as input signals, based on an output signal of the PNMIN gate received as a selected signal.

6. The circuit of claim 5, wherein the C0 gate is configured to:

output a ground voltage when one of a half drain voltage and the drain voltage is received, and output a half drain voltage when the ground voltage is received.

7. The circuit of claim 5, wherein the PNMIN gate is configured to:

output the drain voltage when a minimum voltage among the plurality of input signals applied to the PNMIN gate is a ground voltage or a half drain voltage, and output the ground voltage when the minimum voltage among the applied input signals is the drain voltage.

8. A circuit comprising:

a first full adder;

a second full adder;

a first half adder;

a third full adder configured to receive a sum output signal of the first full adder, a sum output signal of the second full adder, and a sum output signal of the first half adder;

a fourth full adder configured to receive a carry output signal of the first full adder, a carry output signal of the second full adder, and a carry output signal of the first half adder;

a second half adder configured to receive a carry output signal of the third full adder and a sum output signal of the fourth full adder; and a ternary sum gate configured to receive a carry output signal of the second half adder and a carry output signal of the fourth full adder, wherein the third full adder, the second half adder, and the ternary sum gate are configured to output voltage signals corresponding to a sum of logical values indicated by input signals applied to the first full adder, the second full adder, and the first half adder.

9. The circuit of claim 8, wherein the first full adder, the second full adder, the third full adder, and the fourth full adder are ternary full adders (TFAs), and the first half adder and the second half adder are ternary half adders (THAs).

* * * * *